US007965507B2

(12) United States Patent
Nie et al.

(10) Patent No.: US 7,965,507 B2
(45) Date of Patent: Jun. 21, 2011

(54) HEAT DISSIPATION DEVICE HAVING A FAN HOLDER THEREON

(75) Inventors: Wei-Cheng Nie, Shenzhen (CN); Hong-Cheng Yang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 80 days.

(21) Appl. No.: 12/471,457

(22) Filed: May 25, 2009

(65) Prior Publication Data
US 2010/0259896 A1     Oct. 14, 2010

(30) Foreign Application Priority Data

Apr. 13, 2009  (CN) .......................... 2009 1 0301516

(51) Int. Cl.
*H05K 7/20* (2006.01)
*H01L 23/40* (2006.01)

(52) U.S. Cl. ................... 361/697; 361/679.47; 361/695; 165/80.3

(58) Field of Classification Search ............. 361/679.46, 361/679.47, 679.48, 679.54, 690–697, 702–712, 361/715, 719, 720; 165/80.2, 80.3, 80.4, 80.5, 104.33, 104.34, 121–126, 185; 257/706–727; 174/15.1, 16.3, 252; 24/295, 296, 457, 458; 248/505, 510

See application file for complete search history.

(56) References Cited

U.S. PATENT DOCUMENTS

| 6,600,650 | B1 * | 7/2003 | Lee ................................. 361/697 |
| 6,654,246 | B2 * | 11/2003 | Wu .................................. 361/697 |
| 7,131,485 | B2 * | 11/2006 | Yu et al. ......................... 165/80.3 |
| 7,269,010 | B2 * | 9/2007 | Yu et al. .......................... 361/697 |
| 7,289,322 | B2 * | 10/2007 | Chen et al. ..................... 361/695 |
| 7,365,975 | B2 * | 4/2008 | Xia et al. ........................ 361/695 |
| 7,423,873 | B2 * | 9/2008 | Shuai et al. ..................... 361/697 |
| 7,637,310 | B2 * | 12/2009 | Li et al. ......................... 165/80.3 |
| 2009/0020262 | A1 * | 1/2009 | Zhang ............................ 165/80.3 |

* cited by examiner

*Primary Examiner* — Michael V Datskovskiy
(74) *Attorney, Agent, or Firm* — Frank R. Niranjan

(57) ABSTRACT

A heat dissipation device includes a heat sink having a plurality of fins, a fan holder attached to the heat sink and a fan mounted to the heat sink via the fan holder. The fan holder includes a plurality of separated brackets located at sides of the heat sink. Each bracket includes a plurality of mounting plates engaging with the fins of the heat sink and a plurality of elastic tabs formed on two opposite ends thereof. The fan is mounted on the fan holder by engaging with the elastic tabs.

13 Claims, 3 Drawing Sheets

HEAT DISSIPATION DEVICE HAVING A FAN HOLDER THEREON

BACKGROUND

1. Technical Field

The disclosure relates generally to a heat dissipation device, and more particularly to a heat dissipation device having a fan holder for mounting a fan onto a heat sink of the heat dissipation device, wherein the fan can be easily assembled to and disassembled from the fan holder.

2. Description of Related Art

It is well known that during operation computer electronic devices such as central processing units (CPUs) can generate large amounts of heat. The heat must be quickly removed from the electronic device to prevent it from becoming unstable or being damaged. Typically, a heat sink is attached to an outer surface of the electronic device to absorb heat from the electronic device, and the heat absorbed by the heat sink is then dissipated to ambient air.

Generally, in order to improve heat dissipation efficiency of a heat sink, a fan is desired to direct airflow onto the heat sink. It is generally to fix the fan onto the heat sink with screws. Furthermore, it is necessary to disassemble the fan from the heat sink when dust particles accumulate in the fan and the heat sink, whereby the fan and the heat sink can be cleaned. Otherwise, heat dissipation efficiency of the heat sink will be decreased and a lifespan of the fan will be shortened. After cleaning of the fan and heat sink, it is required to assemble the fan to the heat sink again. Both the disassembling and assembling require to rotate the screws by using a screwdriver. Such an unscrewing and screwing operation is laborious and time consuming. In addition, it is possible that the screws or screwdriver may drop to cause damages to computer components in the process of assembling and disassembling.

What is needed, therefore, is a heat dissipation device which has a fan holder for mounting a fan onto a heat sink wherein the fan can be easily assembled to and disassembled from the fan holder without a tool.

BRIEF DESCRIPTION OF THE DRAWINGS

Other advantages and novel features of the disclosure will become more apparent from the following detailed description of an embodiment/embodiments when taken in conjunction with the accompanying drawings.

DETAILED DESCRIPTION

Figure 1:
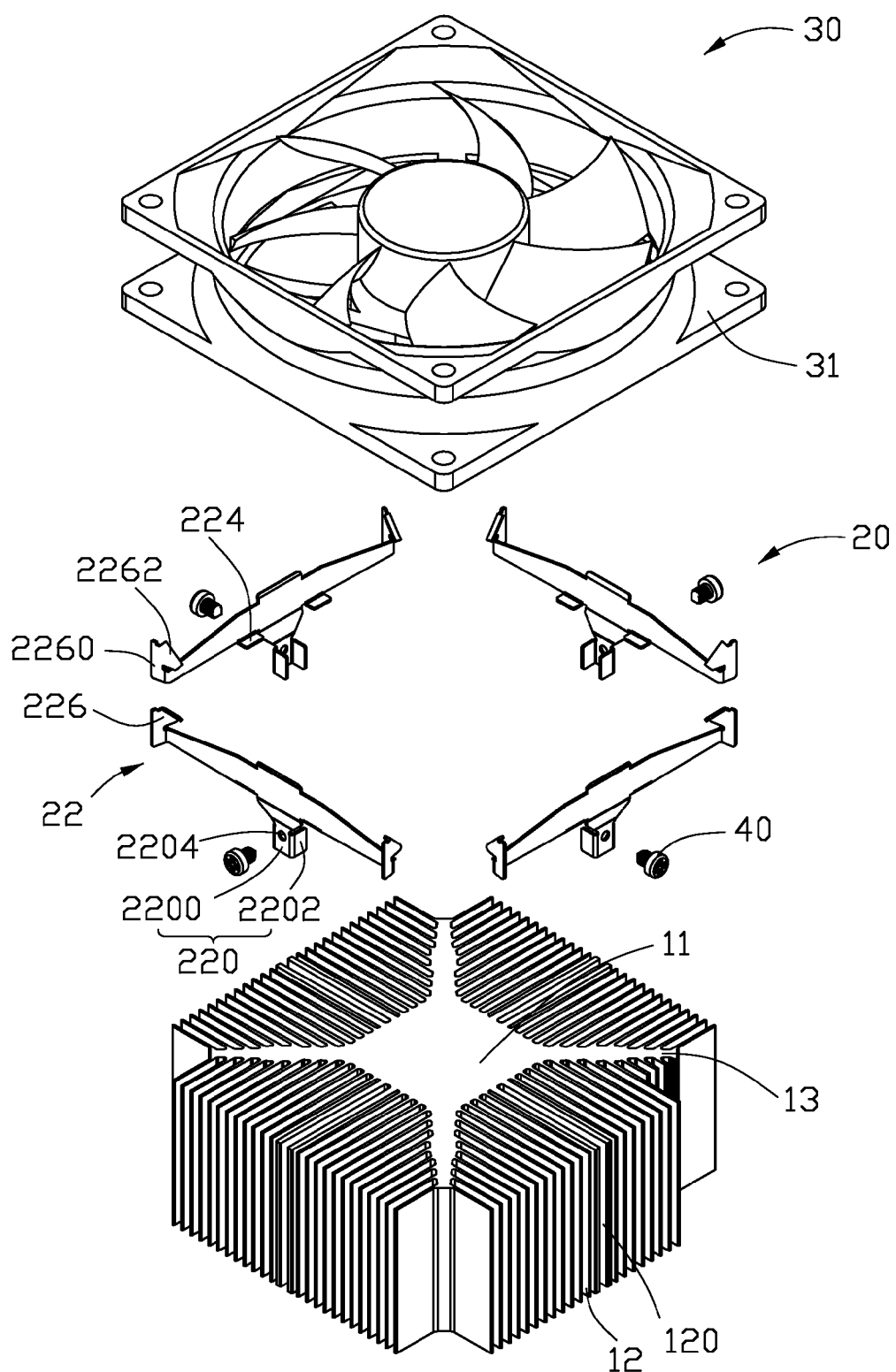
FIG. 1 is an exploded, isometric view of a heat dissipation device in accordance with an exemplary embodiment of the disclosure.
Figure 2:
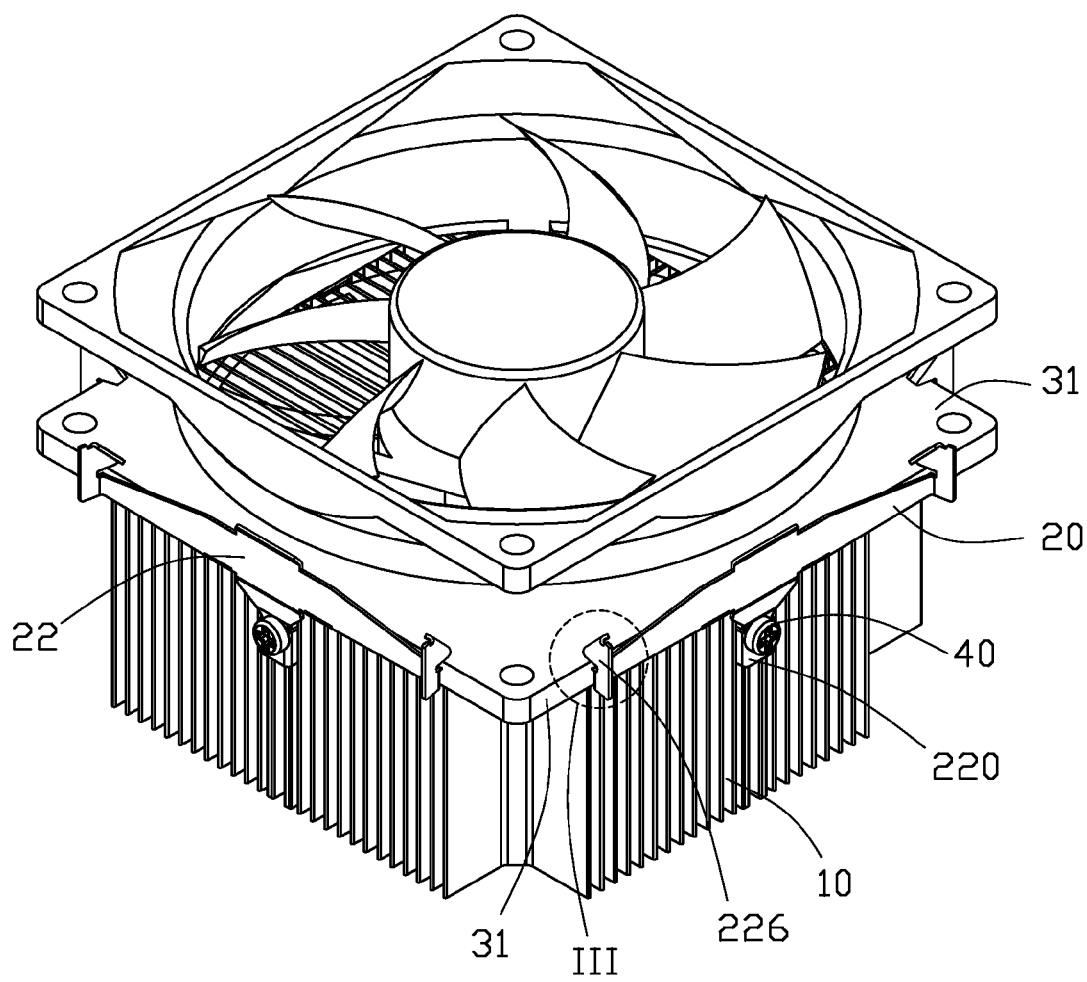
FIG. 2 is an assembled view of FIG. 1.
Figure 3:
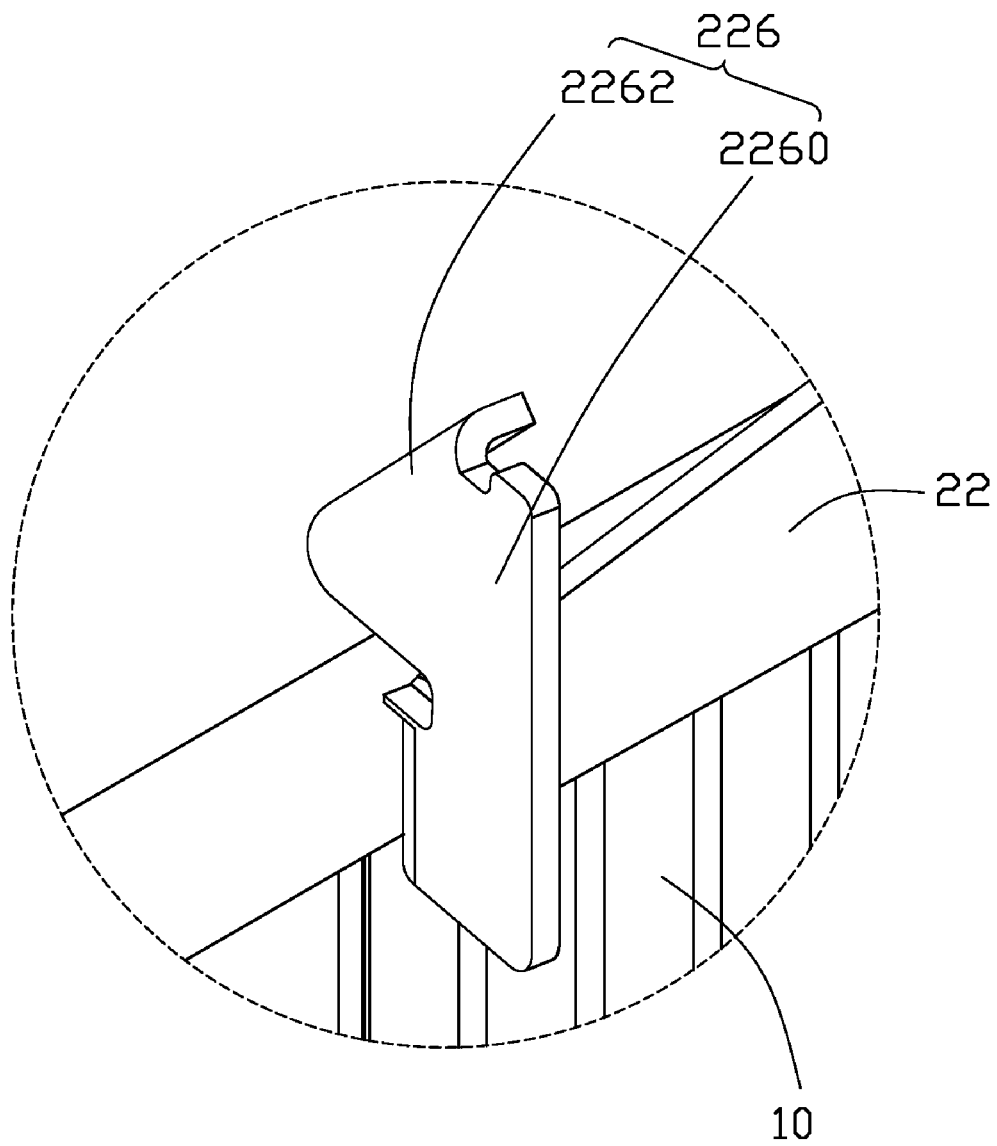
FIG. 3 is an enlarged view of a circled portion III of the heat dissipation device in FIG. 2.

Referring to FIGS. 1-3, a heat dissipation device in accordance with an exemplary embodiment of the disclosure is shown. The heat dissipation device is mounted to a heat-generating electronic element (not shown) to dissipate heat from the heat-generating electronic element. The heat dissipation device comprises a heat sink 10, a fan holder 20 and a fan 30 mounted on the heat sink 10 via the fan holder 20.

The heat sink 10 comprises a cube-shaped core 11 and four symmetrical branches 13 extending outwardly from four corners of the core 11, respectively. A plurality of fins 12 projects outwardly from outer side surfaces of the core 11 and the branches 13. The fins 12 each have a rectangular shape, which is so configured that the heat sink 10 has a square configuration as viewed from a top of the heat sink 10. The fins 12 can be divided into four groups oriented toward four different directions. Four side surfaces of the core 11 and the four branches 13 form four regions. Each group of the fins 12 is located in a corresponding region. Two neighboring groups of the fins 12 are oriented perpendicularly to each other. A pair of adjoining mounting fins 120 each of which is thicker than other fins 12 are formed on a center of each group of the fins 12.

As shown in FIGS. 1 and 3, the fan holder 20 is mounted on a top of the heat sink 10 and comprises four separated brackets 22. The brackets 22 are mounted on top portions of the four groups of the fins 12, respectively. A central opening is enclosed by the brackets 22 for allowing passage of airflow generated by the fan 30 towards the heat sink 10.

Each bracket 22 is integrally formed by a metal with a good heat conductivity, such as a steel, copper or aluminum sheet. The bracket 22 comprises an elongated, plate-shaped body having a gradually decreased height from a middle to two opposite ends thereof, two elastic tabs 226 disposed at two opposite ends of the body, and a mounting portion 220 formed at a middle portion of the body. The mounting portion 220 comprises a mounting plate 2200 extending downwardly from a lower edge of the middle portion of the body of a corresponding bracket 22 and two parallel lateral baffle-plates 2202 extending perpendicularly and inwardly from opposite lateral sides of the mounting plate 2200. A mounting hole 2204 is defined in a corresponding mounting plate 2200, for engagingly receiving a fixtures 40 which extends therethrough. Two pressing portions 224 are formed at two opposite sides of the mounting portion 220 and extend perpendicularly and inwardly from the lower side of each of the brackets 22. Two tabs 226 are folded perpendicularly and outwardly from two opposite ends of a corresponding bracket 22. Each tab 226 has a main body 2260 and a slope 2262 extending inwardly from a lateral side of the main body 2260. The main body 2260 is perpendicular to the body of the bracket 22 and is located over the top of the heat sink 10 when the bracket 22 is mounted to the heat sink 10. When the bracket 22 is mounted to the heat sink 10, the slope 2262 is inclined upwardly and outwardly from the top of the heat sink 10. The slopes 2262 are provided for facilitating the fan 30 to engage with the tabs 226 of the brackets 22.

The fan 30 has a pair of frames 31 each with a square shape. A lower frame 31 of the fan 30 is used to engage with the fan holder 20.

In assembly, the fan holder 20 is placed on the top of the heat sink 10, with the mounting portions 220 of the fan holder 20 sandwiching the adjoining mounting fins 120 of the heat sink 10 therebetween and the pressing portions 224 of the fan holder 20 being attached on the top of the groups of the fins 12 of the heat sink 10. Self-tapping screws 40 extend through the mounting holes 2204 of the fan holder 20 into spaces between the mounting fins 120 and threadedly engage with the mounting fins 120 by self-tapping thereby securely mounting the fan holder 20 onto the heat sink 10. At this time, top portions of each group of the fins 12 abut against the corresponding pressing portions 224 of the fan holder 20 and outer surfaces of the mounting fins 120 abut against inner surfaces of the corresponding lateral baffle-plates 2202 of the mounting portion 220 of the fan holder 20 such that the pressing portions 224 and the baffle-plates 2202 of the fan holder 20 can clasp the mounting fins 120 therebetween and the top portions of each group of the fins 12 to prevent the mounting fins 120 from being deformed outwardly during screwing of the self-tapping screw 40 into the spaces between the mounting fins 120, whereby the fan holder 20 is firmly secured to the top of the heat sink 10 to prevent the fan holder 20 from moving horizontally relative to the heat sink 10. The fan 30 is pressed downwardly towards the top of the heat sink 10 along the slopes 2262 of the tabs 226 of the brackets 22 of the fan holder 20 until the lower frame 31 of the fan 30 is attached to the top of the heat sink 10 and the tabs 226 clasp the frame 31 of the fan 30. The tabs 226 of the brackets 22 of the fan holder 20 abut against an upper surface of the frame 31 of the fan 30 so that the fan holder 20 is firmly secured to the top of the heat sink 10 to prevent the fan holder 20 from moving vertically along a bottom-to-top direction of the heat sink 10. Thus, the fan 30 is fixedly mounted on the fan holder 20. When the fan 30 is needed to be disassembled from the heat sink 10, the engagement between the tabs 226 of the brackets 22 of the fan holder 20 and the lower frame 31 of the fan holder 30 is released by moving the tabs 226 of the brackets 22 of the fan holder 20 outwardly. Then, the fan 30 is pulled out from the tabs 226 of the brackets 22 of the fan holder 20; thus, the fan 30 is detached from the top of the heat sink 10.

By provision of the tabs 226 and the mounting portions 220 of the fan holder 20, the fan 30 can be easily assembled to and disassembled from the fan holder 20 via an operation of the operating tabs 226 of the fan holder 20.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a heat sink comprising a plurality of fins;
   a fan holder mounted on the heat sink, the fan holder comprising a plurality of brackets located at two opposite sides of the heat sink, each bracket comprising a mounting portion abutting against corresponding fins of the heat sink and a plurality of elastic tabs formed at two opposite sides of the mounting portion; and
   a fan mounted on the heat sink via engaging with the elastic tabs of each bracket of the fan holder; wherein the elastic tabs are folded outwardly from two opposite ends of the bracket of the fan holder.

2. The heat dissipation device of claim 1, wherein each tab comprises a slope inclined outwardly along an upward direction to guide the fan towards the fan holder.

3. The heat dissipation device of claim 1, wherein the mounting portion of each bracket of the fan holder comprises a pair of lateral baffle-plates sandwiching two adjoining fins of the heat sink therebetween to position the bracket of the fan holder relative to the fins of the heat sink.

4. The heat dissipation device of claim 3, wherein the two adjoining fins each are thicker than other fins of the heat sink connecting with the corresponding bracket.

5. The heat dissipation device of claim 1, wherein each bracket of the fan holder further comprises a plurality of pressing portions abutting against top portions of the fins of the heat sink.

6. The heat dissipation device of claim 1, wherein the heat sink comprises a core and a plurality of branches extending outwardly from the core, the fins being extended outwardly from the core and the branches.

7. A heat dissipation device comprising:
   a heat sink comprising a core and a plurality of fins extending outwardly from the core;
   a fan holder attached on the heat sink, the fan holder comprising a plurality of separated brackets located at two opposite sides of the heat sink, each bracket comprising a plurality of lateral baffle-plates engaging with the fins of the heat sink to secure the fan holder to the heat sink and a plurality of elastic tabs formed on two opposite ends thereof; and
   a fan mounted on the fan holder by engaging with the elastic tabs of the fan holder.

8. The heat dissipation device of claim 7, wherein the separated brackets each are integrally formed by a metal with a good heat conductivity.

9. The heat dissipation device of claim 8, wherein the tabs each comprise a slope extending outwardly and upwardly from a top of the heat sink.

10. The heat dissipation device of claim 9, wherein the separated brackets each have a gradually decreased height from a middle to the two opposite ends thereof.

11. A heat dissipation device comprising:
    a heat sink comprising a plurality of fins;
    a fan holder mounted on the heat sink, the fan holder comprising a plurality of brackets located at two opposite sides of the heat sink, each bracket comprising:
       a mounting portion abutting against corresponding fins of the heat sink, wherein the mounting portion comprises a pair of lateral baffle-plates sandwiching two adjoining fins of the heat sink therebetween to position the bracket relative to the fins of the heat sink; and
       a plurality of elastic tabs formed at two opposite sides of the mounting portion; and
    a fan mounted on the heat sink via engaging with the elastic tabs of each bracket of the fan holder.

12. The heat dissipation device of claim 11, wherein the two adjoining fins each are thicker than other fins of the heat sink connecting with the corresponding bracket.

13. The heat dissipation device of claim 11, wherein each bracket of the fan holder comprises a plurality of pressing portions abutting against top portions of the fins of the heat sink.

* * * * *